United States Patent [19]
Li

[11] Patent Number: 5,841,184
[45] Date of Patent: Nov. 24, 1998

[54] INTEGRATED EMITTER DRAIN BYPASS CAPACITOR FOR MICROWAVE/RF POWER DEVICE APPLICATIONS

[75] Inventor: Ping Li, Nashua, N.H.

[73] Assignee: The Whitaker Corporation, Wilmington, Del.

[21] Appl. No.: 933,644

[22] Filed: Sep. 19, 1997

[51] Int. Cl.⁶ .................................................. H07L 27/082
[52] U.S. Cl. .......................... 257/580; 257/277; 257/579; 257/728
[58] Field of Search ................................... 257/275, 276, 257/277, 728, 580, 579

[56] References Cited

U.S. PATENT DOCUMENTS

| | | | |
|---|---|---|---|
| 3,414,969 | 12/1968 | Blum | 29/501 |
| 3,918,080 | 11/1975 | Kerr | 357/45 |
| 4,689,655 | 8/1987 | Sonnenberger | 357/45 |
| 5,161,000 | 11/1992 | Koga | 257/728 |
| 5,349,239 | 9/1994 | Sato | 257/579 |
| 5,371,405 | 12/1994 | Kagawa | 257/728 |
| 5,373,185 | 12/1994 | Sato | 257/579 |
| 5,488,252 | 1/1996 | Johansson et al. | 257/579 |
| 5,519,233 | 5/1996 | Fukasawa | 257/728 |
| 5,532,506 | 7/1996 | Tserng | 257/728 |
| 5,612,556 | 3/1997 | Malhi et al. | 257/728 |
| 5,652,693 | 7/1997 | Chou et al. | 361/306.1 |
| 5,696,466 | 12/1997 | Li | 330/286 |

FOREIGN PATENT DOCUMENTS

WO 96/26548  8/1996  WIPO .
WO 97/21246  6/1997  WIPO .
   97/35340  9/1997  WIPO .

OTHER PUBLICATIONS

Electro International 1994, Hynes Convention Center, Boston, MA, "Glass Microwave IC Packaging Technology," Richard Perko, publication date Oct. 5, 1994, pp. 857 through 862.

XP–002053834, 1996 IEEE MTT–S Digest, "A New Technology for Si Microwave Power Transistor Manufacturing," Ping Li, pp. 103 through 105.

European Patent Office, Patent Abstracts of Japan, Publication No. 07221190, Aug. 18, 1995, Sekine Yasuchi, "Semiconductor Integrated Circuit Device".

European Patent Office, Patent Abstracts of Japan Publication No. 05277279, Aug. 20, 1993, Kawashima Shingo, "Hybrid Integrated Circuit".

International Search Report, dated Feb. 13, 1998.

*Primary Examiner*—David B. Hardy
*Attorney, Agent, or Firm*—William Francos

[57] ABSTRACT

A silicon bipolar junction transistor in integrated form is disclosed having a ballast resistance integrated onto a silicon chip. This resistance is for the purpose of thermal stability. In addition, a bypass capacitance circuit is placed in parallel with the ballast resistance again in integrated form. The silicon BJT is flip-chip mounted on a heterolithic microwave integrated circuit glass substrate having the integrated bypass capacitor circuit fabricated directly thereon. This bypass capacitor circuit is electrically in contact with the emitter fingers of the bipolar junction transistor.

10 Claims, 2 Drawing Sheets

INTEGRATED EMITTER DRAIN BYPASS CAPACITOR FOR MICROWAVE/RF POWER DEVICE APPLICATIONS

FIELD OF THE INVENTION

The present invention relates to a bipolar transistor having an integrated bypass capacitor circuit to curb the ill effects of negative feedback resulting from emitter ballast resistance.

BACKGROUND OF THE INVENTION

The present invention relates to a technique for improving the performance of semiconductor bipolar transistors, particularly for power applications.

Semiconductor bipolar devices, especially those used in power applications, are inherently thermally unstable. The problem presented is a self-feeding problem, with the higher temperatures of device operation resulting in an increased current at the collector, which increases the temperature, further increasing the current. Clearly, this circular problem can be reduced or eliminated by the reduction of either current or temperature.

The relationship of pn junction diode current and temperature is well known, and clearly the increase in temperature results in an increase in current, which in turn results in an increase in temperature. A solution to the problem of collector current thermally "run-away" is to place a small but finite resistor at the emitter of the transistor. Then, as the collector current increases, the emitter voltage increases, decreasing the emitter-base voltage, thereby reducing the collector current to an acceptable value one again. This type of negative feedback with a ballasting resistor, the resistors at the emitter fingers, is well known in the field of bipolar junction transistors. In most applications, the ballasting resistance is optimally distributed over the emitter fingers so that the feedback can be effectively utilized to control run-away current in an individual or a small group of emitter fingers. Often times, a thin film or implanted resistor is placed at the end of each emitter finger or pair of fingers. This technique is advantageous in that one can readily modify the resistance value by modifying the geometry of the resistor without changing the resistor fabrication process. Alternatively, one can grow or implant a lightly doped semiconductor region above the device emitter to provide the ballasting resistance. This technique is less advantageous in that it is not as readily modified as the previous described technique. Clearly, the application of integrated ballasting resistors is well known to one of ordinary skill in the art to aid in the reduction or elimination of thermal run-away associated with BJTS, particularly, for power applications.

It is well known that there is heat generated through the operation of the device which may be detrimental to device performance. Accordingly, it is necessary to have means to dissipate heat from the device, preferably at the emitter where the heat is generated. This heat extraction is effected by standard heat sink dissipation techniques, well known to one of ordinary skill in the art. One such technique is effected by mounting the device in an upside-down manner on the heat sink. Accordingly, this process is well known in the art as flip-chip technology. In most cases, the interface between the device contacts in the heat sink is a relatively thick region of metal. This region of metal is deposited in many ways but is usually referred to as a bump.

While it is true that the above referenced technique for creating thermal stability in the transistor provide a significant advantage, the resistance at the emitter fingers intrinsically create a negative feedback which degrades the performance of the device. A well known technique to reduce this negative feedback is to have a bypass capacitor of relatively large magnitude in parallel with the resistor at the emitter finger. This large magnitude bypass capacitance is an effective rf - pass. That is, the reactance from the bypass capacitor circuit is insignificant relative to the ballasting resistor at high frequencies. This enables the rf signal to traverse the bypass capacitor thereby avoiding the ballasting resistor, and thereby avoids "wasting" rf energy in the resistor and reduces the negative feedback in the operational frequency band. This has a direct impact on the overall gain and efficiency of the BJT.

As stated above, the emitter resistor is relatively small, but has a finite resistance value. The capacitor required to effectively create an rf bypass must be relatively large. Unfortunately, it is very difficult to create a bypass capacitor circuit having a large enough capacitance value on the device because of the relatively small area provided at the device level for this capacitor. Attempts to form the bypass capacitance off the chip would have other potential deleterious effects. To this end, if one were to form the bypass capacitance circuit off the chip site, there would be bond wires require to perform the necessary electrical connections. Because the emitters fingers have to be ballasted separately, the size of the bonding wires and wire bond pads has to be less than 10 microns. The technology of today renders this task impossible. Even if it were possible to effect an off chip bypass capacitor, the effect of this circuit layout would severely degrade the performance of the transistor by the parasitic effects induced by the bonding wires. At high frequency, these relatively small diameter bond wires would form undesired inductance elements. These inductance elements form an undesired resonance circuit with the bypass capacitor, causing problems with stability and bandwidth.

Accordingly, what is needed is a technique to fabricate a large bypass capacitance in parallel with the emitter ballast resistor in a bipolar junction transistor in an integrated fashion. This integrated bypass capacitor must reduce the negative feedback at high frequency energy losses associated with the emitter ballast resistance, while not suffering any performance degradation in device stability or bandwidth.

SUMMARY OF THE INVENTION

The present invention is a modified silicon bipolar junction transistor in integrated form having a ballasting resistor integrated onto a silicon chip. This resistor is for the purposes of thermal stability of the transistor during operation. Additionally, a large bypass capacitor circuit is placed in parallel with the ballasting resistor in integrated circuit form. To this end, a modified metallization pattern for the silicon BJT is utilized. A heterolithic microwave integrated circuit glass substrate has the integrated bypass capacitor circuit fabricated directly thereon, and this circuit is electrically in contact with the emitter fingers of the BJT. The BJT is mounted in a flip-chip fashion.

The modified transistor has two emitter contact, the first directly connected to emitter, while the second is connected to the emitter through the integrated balasting resistor. The first emitter contact is connected to the bypass capacitor to form an RF loss less path, while the second emitter contact is connected to a silicon pedestal of the HICK which is connected to electrical ground. The bypass capacitor is fabricated on top of the silicon pedestal, and preferably is a circuit of two or more parallel capacitors, to effect an equivalent capacitance of the desired magnitude in order to properly effect the rf bypass. In the preferred embodiment, the capacitor has three metal layers sandwiching two dielectric layers with electrical connections to form the parallel circuit of the capacitors. These capacitors are formed by standard photolithographic techniques, making large scale fabrication readily possible.

The final design, has the bypass capacitor circuit providing a low loss, low reactance path for the high frequency, for example rf or microwave frequency signal so that the negative feedback caused by the ballasting resistor in prior techniques is minimized as great as possible. The device of the present invention has a higher output power with a higher power gain at a greater efficiency than prior techniques not utilizing the capacitance circuit of the present invention.

The present invention results in a HICK BJT circuit wherein the rf signal is bypassed from the ballasting resistor enabling the use of a larger ballasting resistor without degrading the device performance. Accordingly, the resultant device has better thermal stability than devices not utilizing the capacitor circuit of the present invention.

OBJECTS, FEATURES AND ADVANTAGES

It is an object of the present invention to have a high frequency bipolar junction transistor circuit having better thermal stability and improved efficiency and gain.

It is a feature of the present invention to have an integrated bypass capacitor circuit in parallel with the emitter ballasting resistor.

It is a further feature of the present invention to have the bypass capacitor circuit in integrated circuit form on a HICK.

It is a further feature of the present invention to have a large magnitude capacitance volume in a small physical area.

It is an advantage of the present invention to have a device and circuit readily amenable to large scale fabrication techniques.

DETAILED DESCRIPTION OF THE INVENTION

Figure 1:
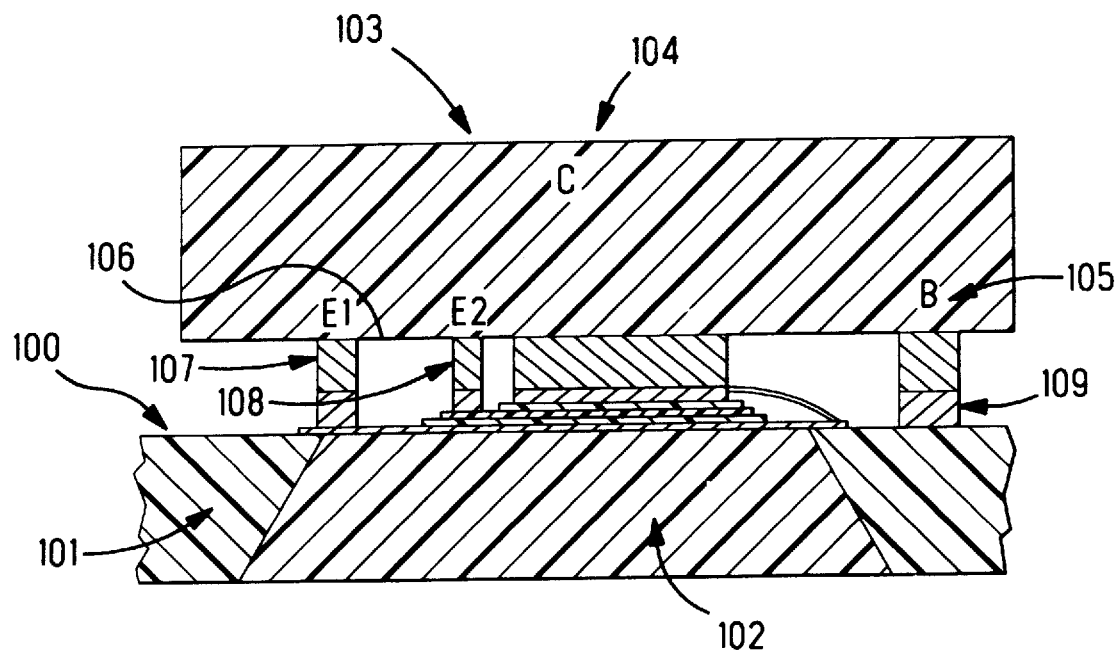
FIG. 1 shows the circuit of the present invention in cross section.
Figure 3:
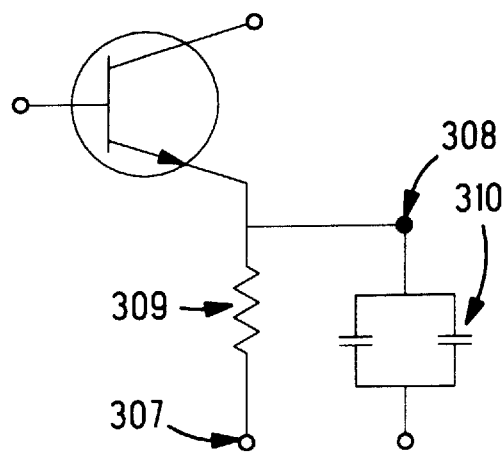
FIG. 3 is a schematic circuit of the silicon transistor and ballasting and bypass circuits of the present invention.

The present invention is shown in cross sectional view in FIG. 1. To this end, a heterolithic microwave integrated circuit (HICK) substrate 100 having regions of glass 101 and silicon pedestals 102 has disposed thereon the bipolar junction transistor (BJT) 103. In the present invention, the BJT is flip-chip mounted with the collector side at 104 the base region at 105 and the emitter at 106. The present invention has emitter region having two contacts designated 107 and 108 respectively. Additionally, as can be seen from FIG. 1, the device 103 is flip-chip mounted. Before going into further detailed explanations of the capacitor circuit in integrated form, it is prudent to review the schematic diagram as is shown in FIG. 3. To this end, the emitter of the modified transistor of the present invention has two emitter contacts, 307 and 308 respectively. The emitter contact 308 is connected to the RF ground through the bypass capacitor circuit 310 as shown. This circuit is a parallel connection of capacitors designated 310. The contact 307 is connected to the emitter through the ballasting resistor 309.

The emitter ballasting resistance can be fabricated with two methods using $p^+$ region in the $p^+$ ring to achieve the required ballasting resistance value or depositing polysilicon over the p region and the required ballasting resistance value can be achieved by adjusting the $As^+$ implantation onto the polysilicon.

Typical values for the ballasting resistor are in the range on order of 75 ohm to 200 ohm per emitter finger and 0.3 to 1 ohm per device and the individual capacitors of the present invention have typical capacitance's on the order of 600 to 900 IF per device for a equivalent reactance in the range of 0.05 to 0.2 ohms/device. These values are chosen for operation in the frequency range on the order of from 1 GHz to 4 GHz.

Figure 2:
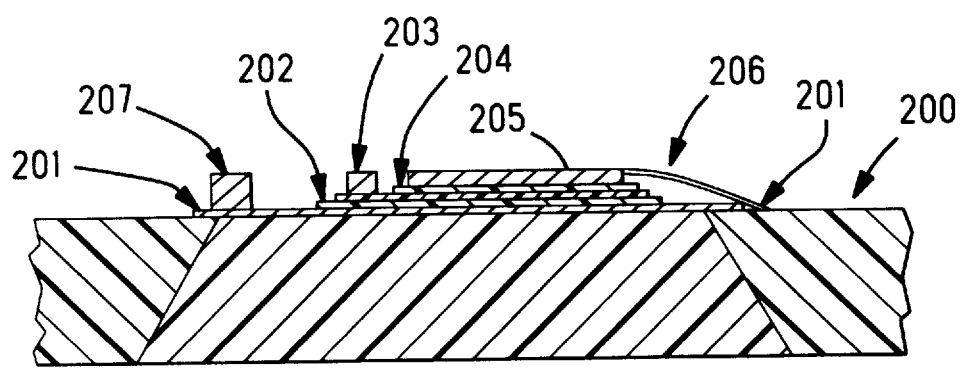
FIG. 2 shows the structure of FIG. 1 prior to the mounting of the BJT chip.

Turning to FIG. 2, the present invention is shown with the BJT not mounted to the HICK substrate. A review of FIG. 2 shows the various elements of the bypass circuitry. To this end, the HICK substrate 200 has a first bottom metal layer 201 with a first layer of dielectric material 202 disposed thereon. The bottom metal layer is electrically connected to a DC ground potential. Thereafter, the middle metal layer 203' is disposed on top of the first dielectric layer 202 and a second dielectric layer 204 is disposed thereon. Finally, a top metal layer 205 together with an airbridge 206 complete the bypass capacitor circuit.

The HMIC substrate of the present invention has embedded silicon pedestals. These are fabricated by standard technique, as is described for example in International Publication No. WO 97/35340, the disclosures of which are specifically incorporated herein by reference. Additionally, other techniques to form HMIC substrates with silicon pedestals to effect the electrical connections, to include electrical ground, are as is described in U.S. Pat. No. 5,696,466 the disclosure of which is specifically incorporated herein by reference. The bypass capacitor of the present invention is fabricated on top of the silicon pedestal. The capacitor has three metal layers and two dielectric layers electrically connected so as to form two capacitors connected electrically in parallel. The resultant capacitance is of a magnitude great enough to effect the low reactance path at the desired frequencies as is described above. The top and bottom metal layers 205 and 201, respectively, form one plate of the capacitor connecting to the ground and the middle metal layer 203' is the other plate of the capacitor connecting to the emitter. These connections are effected by standard metal bumps 203, 207 as is well known to one of ordinary skill in the art. The various layers of metal and dielectric are formed using standard photolithographic processes. Ti/Pt/Au as the electrodes can be put down with standard lift off process while the dielectric thin film can be grown using either CVD or reactive spattering processes. Then the dielectric thin film can be patterned via either wet or dry etching processes. The bottom layer of metal, 201 is disposed directly on top of the silicon pedestal while the top layer 205 is electrically in contact with the ground effected by the silicon pedestal through the airbridge 206. The layers of dielectric material are preferably SiC, having a high dielectric constant and a high thermal conductivity, preferable characteristics for this application. AlN may also be used as dielectric material. The metallization is preferably of Ti/PT/Au. Returning to FIG. 1, the device 103 is bonded onto the silicon pedestal on the HMIC substrate using flip-chip technology well known to one of ordinary skill in the art. As can be seen, the contact 107 for the emitter is used for dc grounding, while the contact 108 for the emitter is used to effect rf grounding through the bypass capacitor. The bonding technique used is as described in P. Li et al. "A New Technology for Si Microwave Power Transistor Manufacturing" IEEE MTT'S Digest 1996, the disclosure of which is incorporated by reference.

Figure 4:
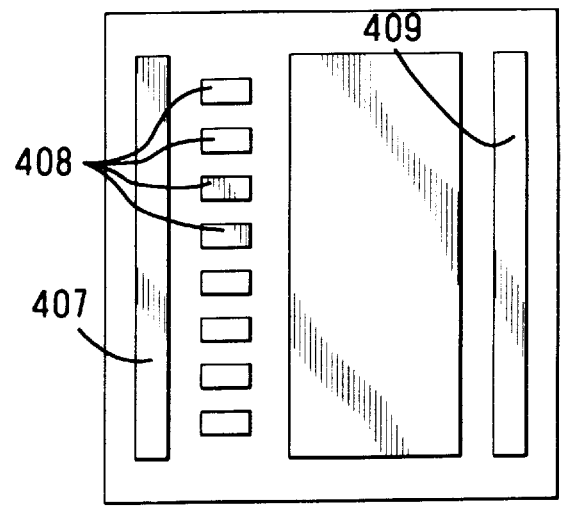
FIG. 4 is a top view of the metal pattern of the silicon transistor of the present invention.
Figure 5:
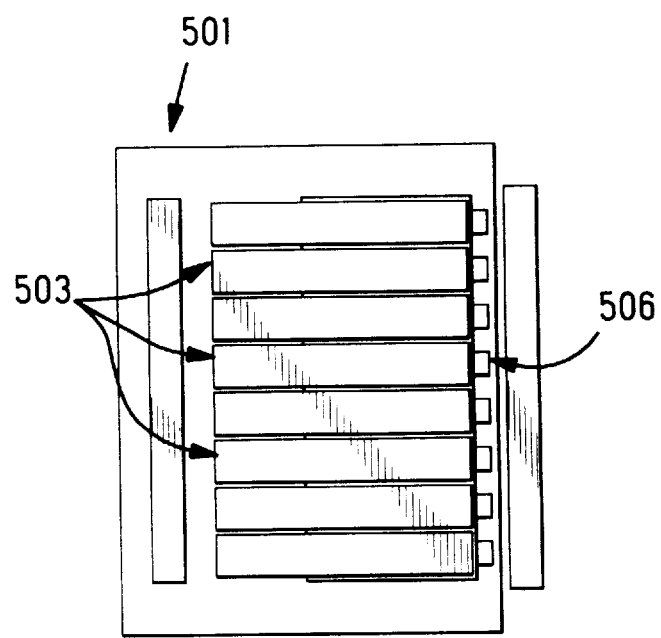
FIG. 5 is the metal pattern of the present invention on the silicon pedestal in the HICK substrate.
Figure 1:
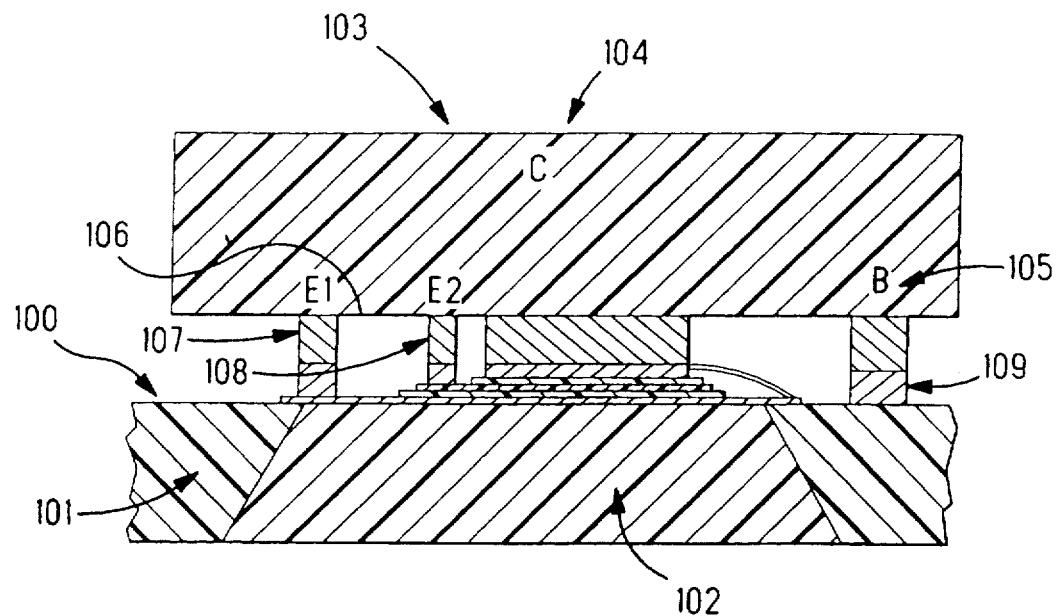
Figure 2:
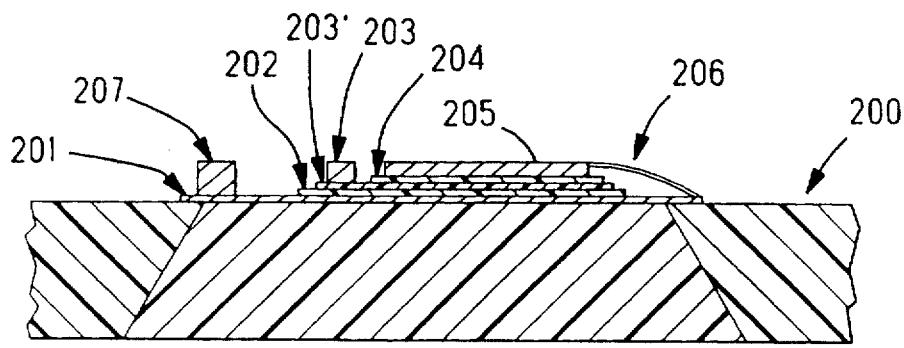
Figure 3:
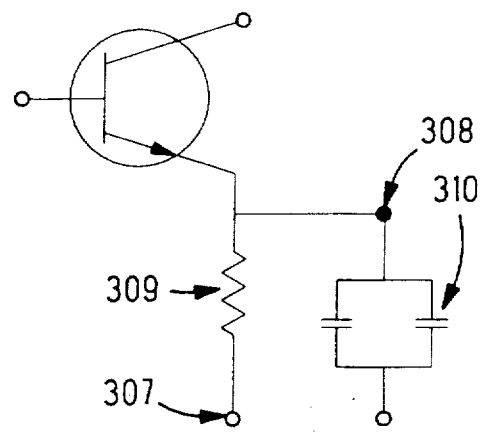
Figure 4:
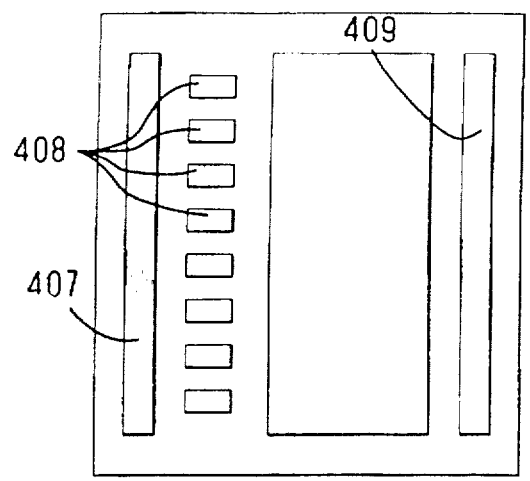
Figure 5:
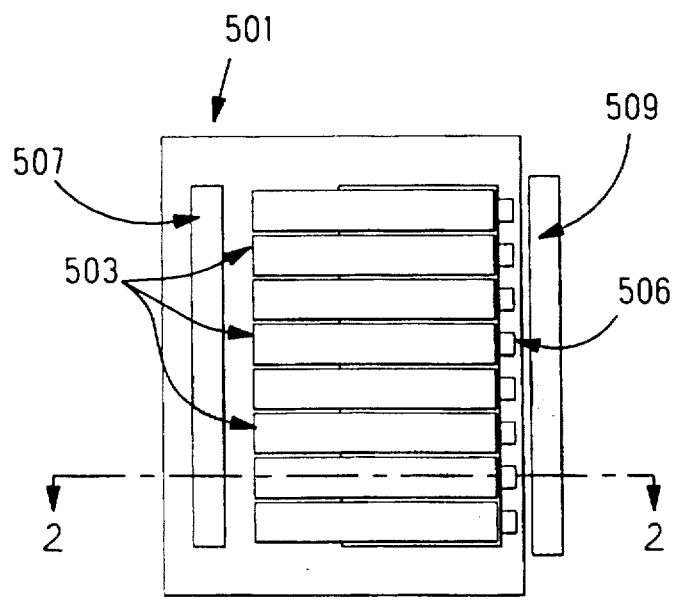

Turning to FIG. 4, the top metal pattern of the silicon transistor is shown with the collector region on the backside of the transistor. To this end, emitter contacts 408 make electrical connections to the middle metal layer as is shown in FIG. 1 and 2, while the emitter contact 407 makes contact to the bottom metal layer as is shown in FIGS. 1 and 2 as well. Finally, the base metallization 409 makes contact to the structure on the HMIC metallization for the base at 109 in FIG. 1. Turning to FIG. 5, the metal pattern on the silicon pedestal in the HMIC substrate is shown. This is a top view of the structure shown in FIG. 2, with the top metal layer (shown at 205 in FIG. 2) and second dielectric layer (shown at 204 in FIG. 2) not shown in FIG. 5. To this end, the middle metal layer 503 is shown as well as the dc ground contact 507, shown at 207 in FIG. 2. DC ground layer 501 is the same as metal layer 201 shown in FIG. 2. Additionally, the airbridge is shown at 506. Metal contact 509 is shown in FIG. 2 at 209 and in FIG. 1 at 109 and is the metalization for the base.

The present invention is designed to operate in frequencies in the range of 1–4 GHz at power output levels on the order of 5–20 w. By the use of the ballasting resistor circuit as well as the bypass capacitor circuit connected in parallel, the present invention is specifically drawn to improving the gain and output power the efficiency of the bipolar junction transistor as is described above, the improvement of thermal stability through the ballasting transistor while curbing the ill effects of the negative feedback of the ballasting resistor through the use of the bypass capacitance circuit described. The primary reason that the structure of the present invention provides the advantages described above is through the use of large scale integrated circuit processing techniques to effect the bypass capacitance. To this end, the ability to fabricate the relatively large capacitance values required to achieve effective bypass capacitor circuit at high frequency in a relatively small area on the chip has great advantage in the performance of the device as well as in the overall cost of fabrication. To this end, the ability of the bypass capacitor circuit to be formed directly on a chip enables the performance realized by avoiding unnecessary resonance conditions as described above in cases where the capacitor circuit is offset of the chip. Because of the ability to fabricate the device in large scale, the additional advantages gained in that the processing techniques well known in VLSI. technology can be utilized, resulting in large scale fabrication through standard processing techniques. This has the attendant advantage of a reduction in cost per device.

The invention having been described in detail, it is clear that variations and modifications of both the devices and materials are within the purview of the artisan of ordinary skill having had the benefit of the present disclosure. To the extent that such modifications in variations are within the theme and teaching of the bypass capacitance on chip bypass circuit as enumerated above, such are deemed to be within the scope of the present invention.

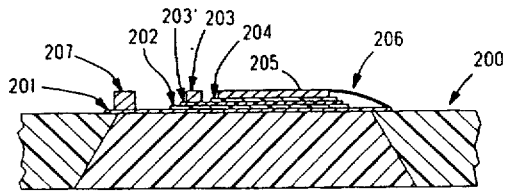

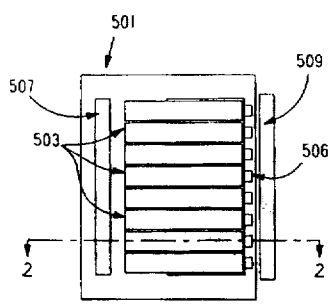

I claim:

1. A bipolar junction transistor mounted on a HMIC substrate having a silicon pedestal electrically connected to ground, said bipolar junction transistor having a first emitter contact and a ballasting resistance connected thereto; and a second emitter contact connected to a bypass capacitance circuit disposed on said HMIC substrate.

2. A bipolar junction transistor as recited in claim 1 wherein said bypass circuit has a first metal layer, a second metal layer and a dielectric layer therebetween, said first metal layer disposed on said silicon pedestal and electrically connected thereto.

3. A bipolar junction transistor as recited in claim 1, wherein said bypass capacitance circuit has a bottom metal layer, a middle metal layer and a top metal layer, with a first dielectric layer between said bottom metal layer and said middle metal layer and a second dielectric layer between said middle metal layer and said top metal layer.

4. A bipolar junction transistor as recited in claim 3 wherein said bypass capacitance circuit further comprises two capacitors connected electrically in parallel.

5. A bipolar junction transistor as recited in claim 1 wherein said capacitance circuit is connected electrically in parallel to said resistance.

6. A transistor having a base, an emitter and a collector, said emitter having first and second emitter contacts; said first emitter contact connected to a resistor and said second emitter contact connected to a bypass capacitor circuit; and said transistor and said bypass circuit mounted on a heterolithic microwave integrated circuit (HMIC) substrate.

7. A transistor as recited in claim 6 wherein said transistor is flip-chip mounted said on heterolithic microwave integrated circuit.

8. A transistor as recited in claim 6 wherein said bypass capacitor circuit has a first metal layer and a second metal layer and dielectric material disposed therebetween; said circuit connected to said emitter contact at one end and connected to electrical ground at another end.

9. A transistor as recited in claim 6 wherein said bypass capacitor circuit is further comprised of two capacitors connected electrically in parallel and said capacitors are further comprised of a bottom metal layer disposed on said HMIC substrate, a top metal layer and a middle metal layer, said bottom metal layer having a first dielectric layer disposed thereon and said middle metal layer having a second dielectric layer disposed thereon.

10. A transistor having a base, an emitter and a collector, said emitter having first and second emitter contacts, said first and second emitter contacts connected electrically in parallel; said first emitter contact connected to a finite resistance and said second emitter contact connected to a bypass capacitor circuit, characterized in that:

said bypass capacitor circuit is disposed on a silicon pedestal of a heterolithic microwave integrated circuit.

* * * * *

UNITED STATES PATENT AND TRADEMARK OFFICE
CERTIFICATE OF CORRECTION

PATENT NO. : 5,841,184
INVENTOR(S) : Ping Li
DATED : November 24, 1998

It is certified that error appears in the above-identified patent and that said Letters Patent is hereby corrected as shown below:

The Title page should be deleted and substitute therefor the attached Title page.

Drawings: Delete Drawing Sheets 1-5, and substitute therefor the Drawing Sheets, consisting of Figs. 1-5, as shown on the attached pages.

```
    Column 3 line 18, delete "HICK" insert --HMIC-- in its
place; line 61 delete "HICK" insert --HMIC-- in its place;
    Column 4 line 28, delete "HICK" insert --HMIC-- in its
place;
    Column 4 line 26, delete "HICK" insert --HMIC-- in its
place.
```

Signed and Sealed this

Thirteenth Day of July, 1999

*Attest:*

Q. TODD DICKINSON

*Attesting Officer*  Acting Commissioner of Patents and Trademarks

United States Patent [19]
Li

[11] Patent Number: 5,841,184
[45] Date of Patent: Nov. 24, 1998

[54] INTEGRATED EMITTER DRAIN BYPASS CAPACITOR FOR MICROWAVE/RF POWER DEVICE APPLICATIONS

[75] Inventor: Ping Li, Nashua, N.H.

[73] Assignee: The Whitaker Corporation, Wilmington, Del.

[21] Appl. No.: 933,644

[22] Filed: Sep. 19, 1997

[51] Int. Cl.$^6$ .................................................. H07L 27/082
[52] U.S. Cl. ........................ 257/580; 257/277; 257/579; 257/728
[58] Field of Search ........................ 257/275, 276, 257/277, 728, 580, 579

[56] References Cited

U.S. PATENT DOCUMENTS

| | | | |
|---|---|---|---|
| 3,414,969 | 12/1968 | Blum | 29/501 |
| 3,918,080 | 11/1975 | Kerr | 357/45 |
| 4,689,655 | 8/1987 | Sonnenberger | 357/45 |
| 5,161,000 | 11/1992 | Koga | 257/728 |
| 5,349,239 | 9/1994 | Sato | 257/579 |
| 5,371,405 | 12/1994 | Kagawa | 257/728 |
| 5,373,185 | 12/1994 | Sato | 257/579 |
| 5,488,252 | 1/1996 | Johansson et al. | 257/579 |
| 5,519,233 | 5/1996 | Fukasawa | 257/728 |
| 5,532,506 | 7/1996 | Tserng | 257/728 |
| 5,612,556 | 3/1997 | Malhi et al. | 257/728 |
| 5,652,693 | 7/1997 | Chou et al. | 361/306.1 |
| 5,696,466 | 12/1997 | Li | 330/286 |

FOREIGN PATENT DOCUMENTS

| | | |
|---|---|---|
| WO 96/26548 | 8/1996 | WIPO |
| WO 97/21246 | 6/1997 | WIPO |
| 97/35340 | 9/1997 | WIPO |

OTHER PUBLICATIONS

Electro International 1994, Hynes Convention Center, Boston, MA. "Glass Microwave IC Packaging Technology," Richard Perko, publication date Oct. 5, 1994, pp. 857 through 862.

XP–002053834, 1996 IEEE MTT–S Digest, "A New Technology for Si Microwave Power Transistor Manufacturing," Ping Li, pp. 103 through 105.

European Patent Office, Patent Abstracts of Japan, Publication No. 07221190, Aug. 18, 1995, Sekine Yasuchi, "Semiconductor Integrated Circuit Device".

European Patent Office, Patent Abstracts of Japan Publication No. 05277279, Aug. 20, 1993, Kawashima Shingo, "Hybrid Integrated Circuit".

International Search Report, dated Feb. 13, 1998.

*Primary Examiner*—David B. Hardy
*Attorney, Agent, or Firm*—William Francos

[57] ABSTRACT

A silicon bipolar junction transistor in integrated form is disclosed having a ballast resistance integrated onto a silicon chip. This resistance is for the purpose of thermal stability. In addition, a bypass capacitance circuit is placed in parallel with the ballast resistance again in integrated form. The silicon BJT is flip-chip mounted on a heterolithic microwave integrated circuit glass substrate having the integrated bypass capacitor circuit fabricated directly thereon. This bypass capacitor circuit is electrically in contact with the emitter fingers of the bipolar junction transistor.

10 Claims, 2 Drawing Sheets